(12) United States Patent
Yim et al.

(10) Patent No.: US 12,100,951 B2
(45) Date of Patent: Sep. 24, 2024

(54) SYSTEM FOR ESTIMATING RENEWABLE ENERGY GENERATION QUANTITY IN REAL-TIME

(71) Applicant: Encored Technologies, Inc., Seoul (KR)

(72) Inventors: Jae Ryun Yim, Seoul (KR); Kyung Nam Park, Seoul (KR); Rae Kyun Kim, Seoul (KR)

(73) Assignee: Encored Technologies, Inc., Seoul (KR)

( * ) Notice: Subject to any disclaimer, the term of this patent is extended or adjusted under 35 U.S.C. 154(b) by 413 days.

(21) Appl. No.: 17/361,624

(22) Filed: Jun. 29, 2021

(65) Prior Publication Data

US 2022/0352714 A1 Nov. 3, 2022

(30) Foreign Application Priority Data

Apr. 28, 2021 (KR) .......................... 10-2021-0054940

(51) Int. Cl.
| | |
|---|---|
| *H02J 3/00* | (2006.01) |
| *G01R 22/06* | (2006.01) |
| *G06N 3/02* | (2006.01) |
| *G06N 20/00* | (2019.01) |
| *H02J 3/38* | (2006.01) |
| *H02S 50/10* | (2014.01) |
| *H02S 40/32* | (2014.01) |

(52) U.S. Cl.
CPC .............. *H02J 3/004* (2020.01); *G01R 22/06* (2013.01); *G06N 3/02* (2013.01); *G06N 20/00* (2019.01); *H02J 3/381* (2013.01); *H02S 50/10* (2014.12); *H02J 2300/24* (2020.01); *H02S 40/32* (2014.12)

(58) Field of Classification Search
CPC ........ H02J 3/004; H02J 3/381; H02J 2300/24; G01R 22/06; G06N 3/02; G06N 20/00; G06N 3/0442; G06N 3/09; G06N 20/20; H02S 50/10; H02S 40/32; H02S 50/00; Y02E 10/50
USPC .......................................................... 700/286
See application file for complete search history.

(56) References Cited

U.S. PATENT DOCUMENTS

| | | | |
|---|---|---|---|
| 11,367,142 B1* | 6/2022 | Wang .................. | G06F 16/2456 |
| 2014/0058572 A1* | 2/2014 | Stein ...................... | G06Q 50/06 |
| | | | 700/291 |
| 2020/0372588 A1* | 11/2020 | Shi .......................... | G06N 3/08 |

* cited by examiner

*Primary Examiner* — Mohammad Ali
*Assistant Examiner* — Saad M Kabir
(74) *Attorney, Agent, or Firm* — Scale LLP; Seongyoune Kang (57) ABSTRACT

A system for estimating a real-time renewable energy generation quantity according to an embodiment of the present disclosure includes a site setting unit for setting a benchmarking group based on geographical locations of a plurality of renewable energy generation sites and setting a benchmarking site for each benchmarking group, a site generation quantity calculation unit for calculating a real-time generation quantity prediction value of each of sites except the benchmarking site among the sites included in the benchmarking group by using a preset prediction model based on a real-time generation quantity actual-measurement value of the corresponding benchmarking site, and a total generation quantity estimation unit for estimating a total real-time generation quantity of all the sites by summing the calculated real-time generation quantity prediction values for the respective sites and the real-time generation quantity actual-measurement value of the benchmarking site.

10 Claims, 8 Drawing Sheets

SYSTEM FOR ESTIMATING RENEWABLE ENERGY GENERATION QUANTITY IN REAL-TIME

CROSS REFERENCE TO RELATED APPLICATION

This application is based on and claims priority under 35 U.S.C. 119 to Korean Patent Application No. 10-2021-0054940, filed on Apr. 28, 2021, in the Korean Intellectual Property Office, the disclosures of which is herein incorporated by reference in their entireties. This invention was supported by Korea Institute of Energy Technology Evaluation and Planning(KETEP) grant funded by the Korea government (MOTIE) (No. 1415168353).

BACKGROUND OF THE INVENTION

1. Technical Field

The present disclosure relates to a system for estimating a real-time renewable energy generation quantity, and more particularly, to a system for estimating a real-time renewable energy generation quantity of all sites by predicting a real-time generation quantity prediction value of each of generation sites within a corresponding benchmarking group based on a real-time generation quantity actual-measurement value of the corresponding benchmarking site among a plurality of generation sites that are benchmarked and grouped based on geographical locations.

2. Description of the Related Art

The amount of consumption of electric energy continues to increase worldwide. However, since the amount of energy resources based on fossil fuel is limited, there is a tendency to increase the proportion of power production of renewable energy generation sources, such as solar energy generation and wind power generation.

If electric energy is produced using such renewable energy generation, the importance of electric energy becomes more important because environmental pollutants, such as green-house gases and fine dust, can be reduced and energy supply stability can be improved from a viewpoint of sustainable future energy.

Among them, the supply of solar power systems is spread due to advantages in that an installation location is less limited and an installation size can be freely determined according to circumstances.

However, output power of the solar power system is changed all day due to the influence of external factors, such as dust, cloud, and snow, and is also greatly influenced by seasonal factors. It is necessary to estimate output power of such a solar power system in real time by monitoring solar energy generation output power in order to improve output power uncertainty, improve reliability of a power system and enhance power quality.

PRIOR ART DOCUMENT

Patent Document (Patent Document 0001) Korean Patent No. 10-1882106 (Aug. 24, 2018)

SUMMARY OF THE INVENTION

An object of the present disclosure is to provide a system for estimating a real-time renewable energy generation quantity, which can estimate a real-time renewable energy generation quantity of all sites by predicting a real-time generation quantity prediction value of each of generation sites within a corresponding benchmarking group through a prediction model based on a real-time generation quantity actual-measurement value of a benchmarking site among a plurality of generation sites that are benchmarked and grouped based on geographical locations.

Technical objects of the present disclosure are not limited to the aforementioned technical object, and other technical objects not described above may be evidently understood by a person those skilled in the art from the following description.

In order to achieve the aforementioned object, a system for estimating a real-time renewable energy generation quantity according to an embodiment of the present disclosure may include a site setting unit for setting a benchmarking group based on geographical locations of a plurality of renewable energy generation sites and setting a benchmarking site for each benchmarking group, a site generation quantity calculation unit for calculating a real-time generation quantity prediction value of each of sites except the benchmarking site among the sites included in the benchmarking group by using a preset prediction model based on a real-time generation quantity actual-measurement value of the corresponding benchmarking site, and a total generation quantity estimation unit for estimating a total real-time generation quantity of all the sites by summing the calculated real-time generation quantity prediction values for the respective sites and the real-time generation quantity actual-measurement value of the benchmarking site.

Furthermore, the site setting unit may set, as a benchmarking site of each benchmarking group, a site located at the shortest distance from a center location of the corresponding benchmarking group among generation sites included in the corresponding benchmarking group.

Furthermore, the site setting unit may set the center location of each benchmarking group by applying a preset gathering algorithm to all the sites.

In this case, the site setting unit may randomly select given k center locations and generates k benchmarking groups based on the geographical locations, and may finally set a benchmarking group and the center location of each benchmarking group by repeatedly performing a first process of calculating a straight-line distance from the center location randomly selected with respect to each site and including the corresponding site in a benchmarking group including a center location having the closest distance and a second process of setting, as a new center location, a location where a sum of distances from sites within each benchmarking group is a minimum until the center location is not changed.

Furthermore, the site generation quantity calculation unit may calculate the real-time generation quantity prediction value each of the sites by using one prediction model of a random forest or a long short term memory (LSTM).

Furthermore, input data of the random forest model may include, as the input data, a normalized generation quantity of a benchmarking site at current timing, weather elements, a solar radiation estimate, reference DC/AC power, a DC/AC power estimate, and time information. Output data of the random forest model may include a normalized generation quantity prediction value of a corresponding specific site at current timing.

In this case, the random forest model may generate a plurality of tree models based on a relation between the input data and the output data and predicts the normalized generation quantity prediction value of the corresponding specific site at the current timing based on a generation quantity prediction value predicted through each tree model.

Furthermore, the LSTM model calculates a prediction value based on machine learning by using an artificial neural network structure having a temporal connection relation (time-series) based on values of input elements at target prediction timing, that is, at current timing or in k steps (wherein k is a natural number) including current timing.

In this case, the values of the input elements may include a normalized generation quantity of a benchmarking site, weather elements, a solar radiation quantity estimate, reference DC/AC power, DC/AC power estimates based on a physical model, and a k-step time-series value for time information. An output element may include a normalized generation quantity prediction value of a corresponding specific site at current timing.

Furthermore, the site generation quantity calculation unit may obtain a corresponding capacity by selecting a benchmarking site closest to a specific site which is a target whose real-time generation quantity prediction value is to be calculated, and may calculate a normalized generation quantity of the benchmarking site by dividing a generation quantity actual-measurement value of the selected benchmarking site at current timing by the corresponding capacity.

Furthermore, the site generation quantity calculation unit may calculate the final real-time generation quantity prediction value by multiplying a normalized generation quantity prediction value of the specific site at current timing, which is calculated through the prediction model, by the capacity of the corresponding specific site.

The system for estimating a real-time renewable energy generation quantity according to embodiments of the present disclosure can estimate a real-time renewable energy generation quantity of all sites by predicting a real-time generation quantity prediction value of each of generation sites within a corresponding benchmarking group through the prediction model based on a real-time generation quantity actual-measurement value of a benchmarking site among a plurality of generation sites that are benchmarked and grouped based on geographical locations.

Furthermore, according to embodiments of the present disclosure, the accuracy of prediction through the existing artificial intelligence-based machine learning can be significantly improved using a physical model as an input.

DESCRIPTION OF REFERENCE NUMERAL 100-1~100-$n$: RTU 200: estimation server
300: database
400: power selling and purchase system
350: sensor 210: site setting unit
220: site generation quantity calculation unit
221: data collection unit
222: data pre-processing unit
223: physical model operation unit
224: generation quantity estimation operation unit
226: machine learning operation unit
226: control unit
230: total generation quantity estimation unit
240: processor 250: communication unit

DETAILED DESCRIPTION

Advantages and characteristics of the disclosure and a method for achieving the advantages and characteristics will become apparent from the embodiments described in detail in conjunction with the accompanying drawings. However, the disclosure is not limited to the disclosed embodiments, but may be implemented in various different forms. The embodiments are provided to only complete the disclosure and to fully notify a person having ordinary knowledge in the art to which the disclosure pertains of the category of the disclosure. The disclosure is defined by the category of the claims. The size of an element illustrating in the drawings and a relative size thereof may have been exaggerated for the clarity of description. Throughout the specification, the same reference numerals denote the same elements. The term "and/or" includes each of mentioned items or all combinations of one or more of the mentioned items.

Terms used in this specification are for illustrating the embodiments and are not intended to limit the present disclosure. In the specification, the singular form, unless specially described otherwise in the context, also includes the plural form. The terms "comprises" and/or "comprising" used in the specification means that the presence or addition of one or more other elements is not excluded in addition to an aforementioned element.

Although a first, a second, etc. are used to describe various element or constituent elements, these elements or constituent elements are not limited by such terms. The terms are used to merely distinguish between one element or constituent element and another element or constituent element. Accordingly, a first element or constituent element described hereinafter may be a second element or constituent element within the technical spirit of the present disclosure.

All terms (including technical and scientific terms) used in this specification, unless defined otherwise, will be used as meanings which may be understood in common by a person having ordinary knowledge in the art to which the present disclosure pertains. Furthermore, terms used and defined in common dictionaries are not construed as being ideal or excessive unless specially defined otherwise.

The following detailed description is not intended to be taken as a limited meaning, and the scope of the present disclosure is limited by only the claims along all ranges equivalent to things in the claims, if properly described. In the drawings, similar reference numerals denote the same or similar functions in several aspects.

Figure 1:
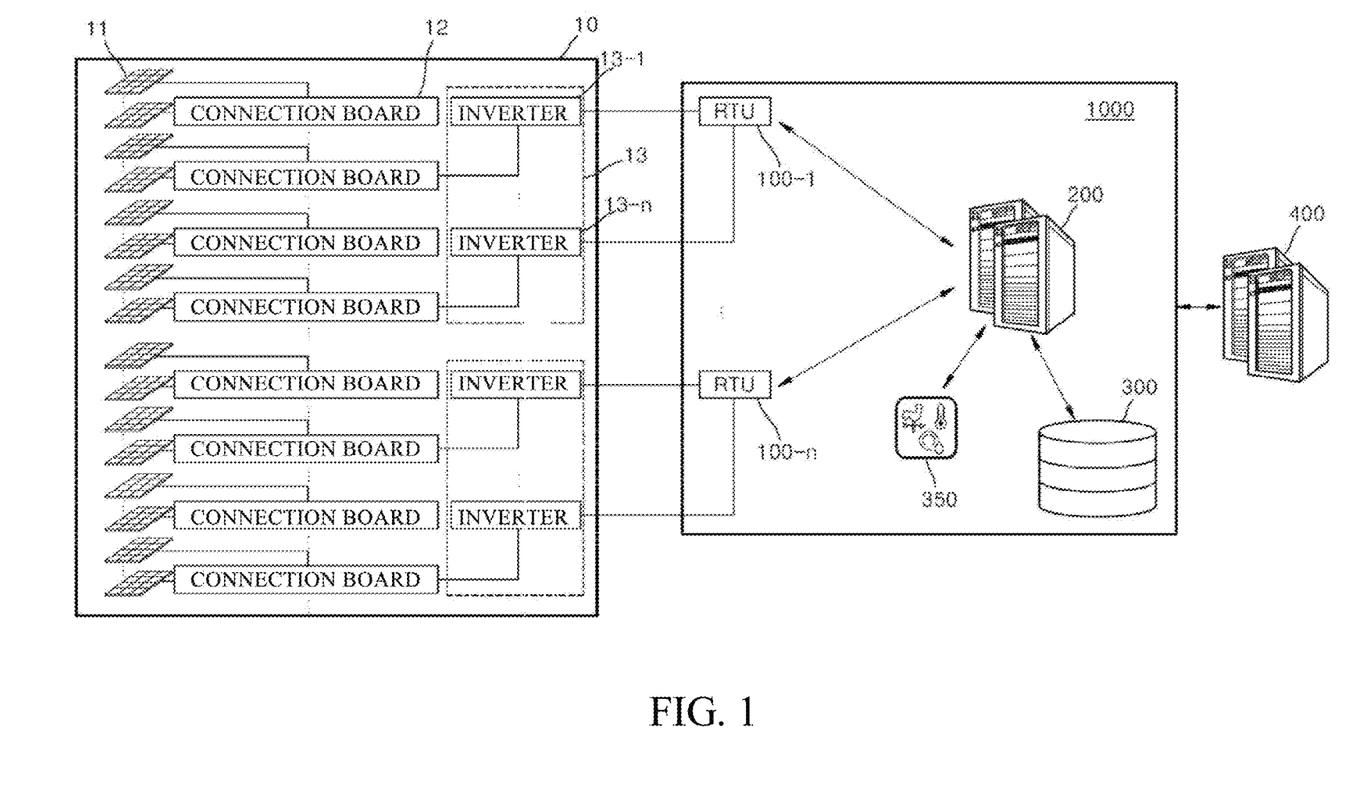
FIG. 1 is a diagram for describing a schematic configuration of a system for estimating a real-time renewable energy generation quantity according to an embodiment of the present disclosure.

FIG. 1 is a block diagram for describing a schematic configuration of a system for estimating a real-time renewable energy generation quantity according to an embodiment of the present disclosure. The system 1000 for estimating a real-time renewable energy generation quantity (hereinafter referred to as an "estimation system") according to an embodiment of the present disclosure may perform a function of receiving data necessary to estimate a renewable energy generation quantity, such as a temperature and a solar radiation quantity, from an external server or a database 300, for example, estimating a real-time renewable energy generation quantity in an area, and providing a virtual power plant (VPP) and a power exchange with a real-time generation quantity prediction value for each site and a total real-time generation quantity estimate.

In an embodiment of the present disclosure, solar energy generation is described, but the present disclosure may also be used for the real-time estimation of renewable energy generation, such as solar heat, bio, wind power, water power, and fuel.

In this case, the VPP means small-sized generation equipment, such as energy generation, storage batteries, or fuel cells distributed like solar energy for homes, and a virtual power plant for integrating and managing power demands based on cloud in a software way, for example. It is essential for the VPP to predict an accurate generation quantity because it is necessary to supply the amount of power satisfying power demands by predicting a generation quantity in related generation equipment. The power exchange needs to secure real-time generation quantity data for a stable market operation.

Accordingly, the present disclosure has an object of estimating a total real-time generation quantity of all sites by predicting a real-time generation quantity of other sites based on a real-time generation quantity actual-measurement value of a benchmarking site.

Referring to FIG. 1, the estimation system 1000 according to an embodiment of the present disclosure receives an actual generation quantity of a solar energy module array from solar energy generation equipment 10 connected thereto.

Specifically, the estimation system 1000 according to an embodiment of the present disclosure may include an RTU 100-1 capable of receiving data of an actual solar generation quantity, an estimation server 200, a database 300 and various sensors 350 installed near the solar energy module array 11. In this case, the estimation system 1000 may be connected to the solar energy generation equipment 10 and a power selling and purchase system 400, that is, a power exchange.

The solar energy generation equipment 10 may include the solar energy module array 11, a connection board and an inverter 13. In an embodiment of the present disclosure, FIG. 1 has been illustrated, but a method of coupling the elements may be easily changed by a designer.

A plurality of solar cell modules for converting, into electric energy, solar energy incident on surfaces thereof is connected to the solar energy module array 11 in series or in parallel. The solar energy module array 11 may provide a DC current to the connection board 12. A plurality of solar energy module arrays 11 may be connected to one connection board 12.

The connection board 12 may measure voltage information and current information for each solar energy module and for each time zone. A plurality of solar energy module arrays 11 may be connected to the connection board 12 in parallel. The connection board 12 may connect and collect DC power generated from the solar energy module array 11 in series/in parallel by connecting the solar energy module array 11 and an inverter 13-1. At least one connection board 12 may be connected to one inverter 13-1.

The inverter 13 is connected to the plurality of connection boards 12 through a cable, etc., and may be supplied with DC power from the connection boards. Furthermore, the inverter 13-1 may convert, into AC, generation power provided by the connection board 12 in a DC form, so that the AC is transmitted through a system power. In this case, information on the AC power generated by the inverter may be monitored by the estimation system in real time through remote terminal units (RTUs) 100-1 to 100-n for each site. The RTU 100-1 may store, in the database 300, an actual generation quantity of the solar energy module arrays 11, which is necessary for prediction in the estimation server 200 of the estimation system 1000. The RTU 100-1 and the inverter 13-1 may be connected through wired/wireless communication means.

Furthermore, the estimation server 200 may obtain information, such as a surface temperature of a solar energy module cell, a site temperature of the solar energy module array 11, humidity, and a wind direction, from the sensors 350 installed around the solar energy module array, and may use the information when calculating a real-time generation quantity prediction value of each site.

Figure 2:
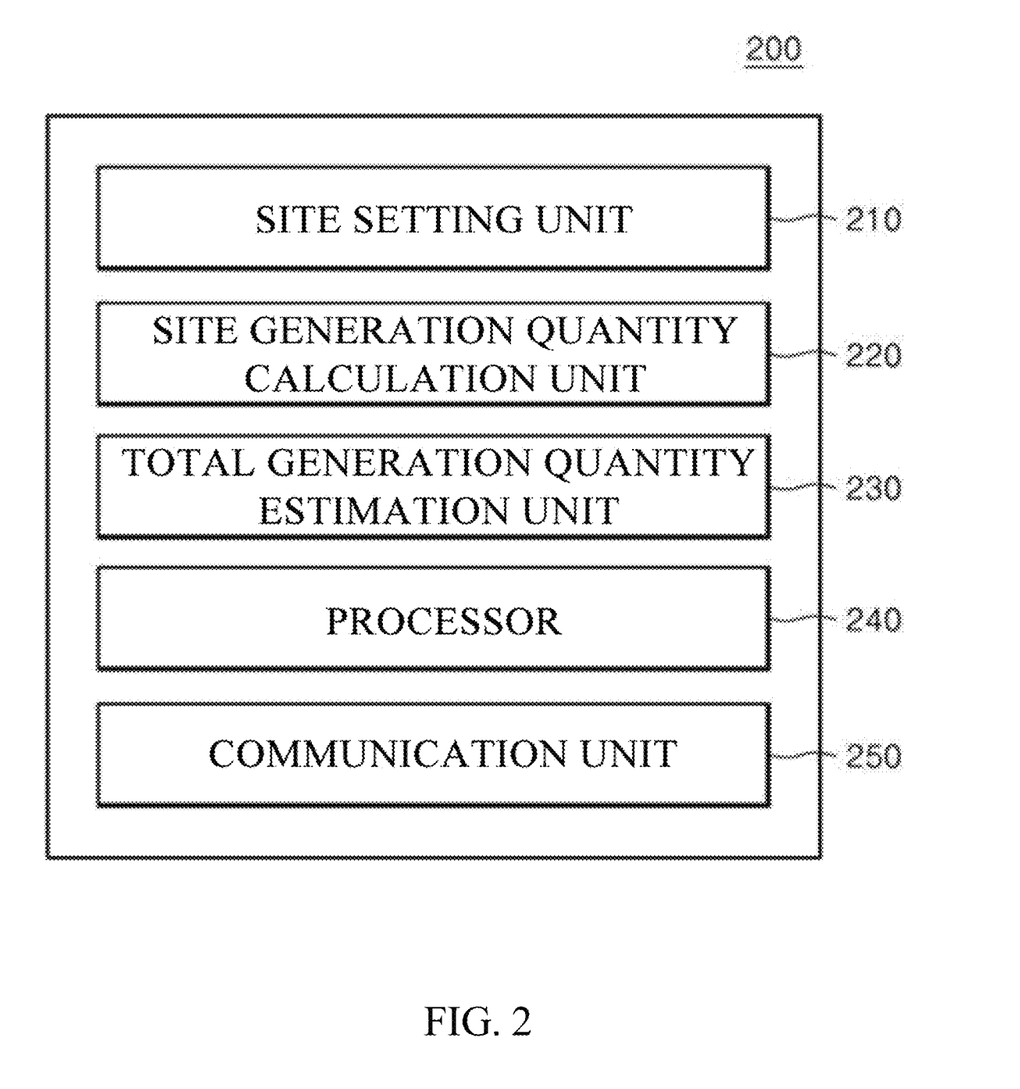
FIG. 2 is a block diagram for describing a configuration of an estimation server according to an embodiment of the present disclosure.

Hereinafter, elements of the estimation server 200 are described in detail with reference to FIG. 2. FIG. 2 is a block diagram for describing a configuration of the estimation server according to an embodiment of the present disclosure.

Referring to FIG. 2, the estimation server 200 according to an embodiment of the present disclosure may include a site setting unit 210, a site generation quantity calculation unit 220, a total generation quantity estimation unit 230, a processor 240 and a communication unit 250.

The site setting unit 210 may set a benchmarking group based on geographical locations of a plurality of generation sites, and may set a benchmarking site for each benchmarking group. In this case, the site setting unit 210 may set a center location of each benchmarking group by applying a preset gathering algorithm to all the sites, and may set, as a benchmarking site of a corresponding benchmarking group, a site located at the shortest distance from the center location of a corresponding benchmarking group among generation sites included in each benchmarking group.

Specifically, given k center locations may be randomly selected, and k benchmarking groups may be generated. In this case, a straight-line distance from a center location randomly selected with respect to each site may be calculated and included in a benchmarking group including a center location at the closest distance. A process of setting, as a new center location, a location where the sum of distances from sites within each benchmarking group is a minimum may be repeatedly performed until the center location and a boundary (solid line in FIG. 3) of the benchmarking group are not changed. Accordingly, finally, a benchmarking group and the center location of each benchmarking group may be set. A site located at the shortest distance from a center location of each benchmarking group may be selected as a benchmarking site.

Figure 3:
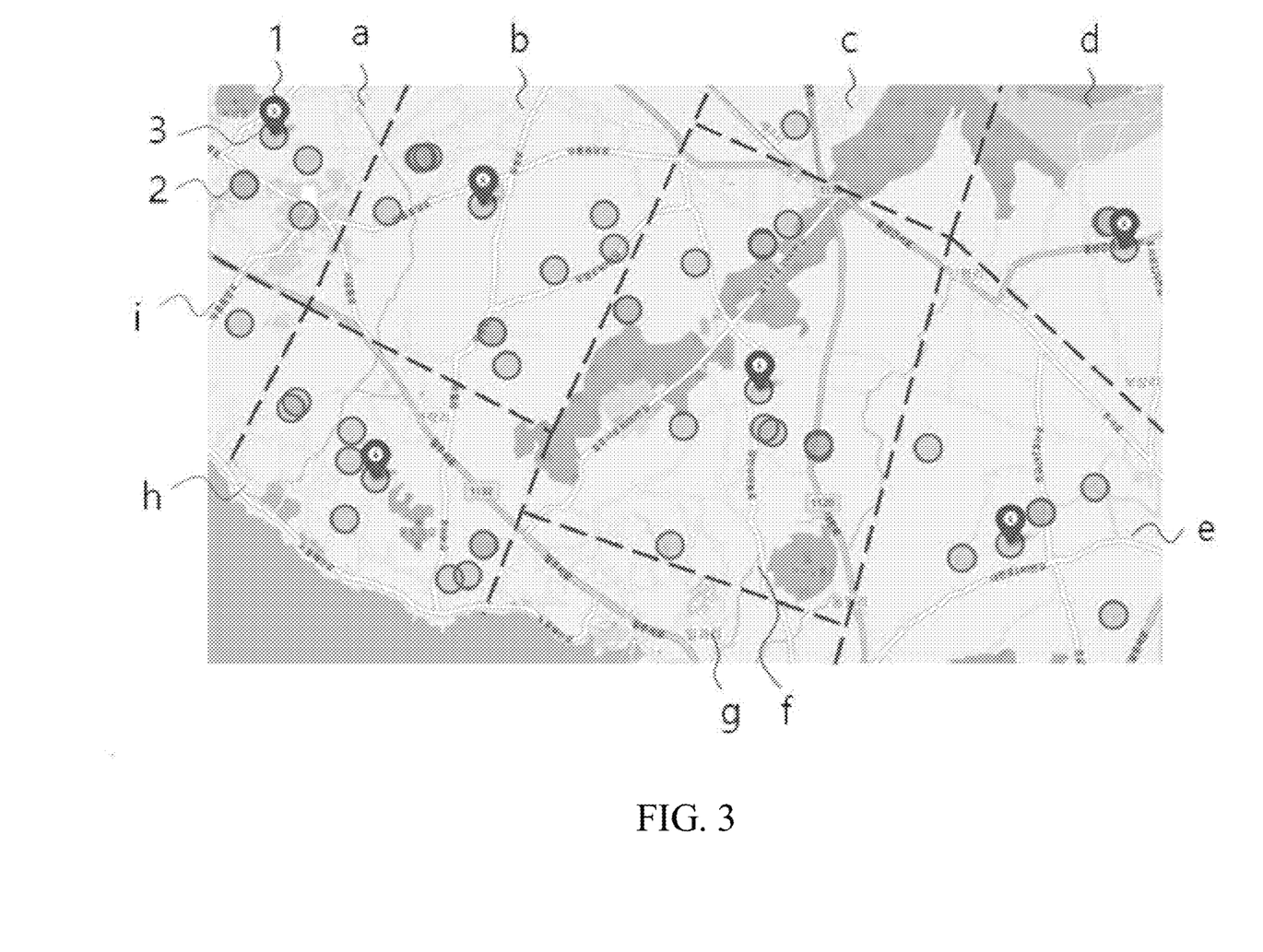
FIG. 3 is a diagram for describing the setting of a benchmarking group based on a geographical location according to an embodiment of the present disclosure.

Referring to FIG. 3, all of sites may be divided into a preset number of benchmarking groups "a" to "i" based on geographical locations of all the sites. The center location 1 of each of the benchmarking groups "a" to "i" may be set.

In this case, a site closest to the center location 1 among a plurality of generation sites included in each of the benchmarking groups "a" to "i", may be set as a benchmarking site 3. That is, each of the benchmarking groups "a" to "i" may become a group in which the center location 1 is set and which includes one benchmarking site 3 and at least one specific site 2.

With respect to each benchmarking group, the estimation server 200 according to an embodiment of the present disclosure may obtain a real-time generation quantity actual-measurement value of the benchmarking site 1, and may estimate a total real-time generation quantity of all sites by predicting a real-time generation quantity prediction value of at least one specific site 2 (other sites within a corresponding benchmarking group except the benchmarking site) based on the obtained real-time generation quantity actual-measurement value of the benchmarking site 1.

In this case, the real-time generation quantity prediction values of the specific sites 2 except the benchmarking site 1, which are included in each benchmarking group, may be calculated through the site generation quantity calculation unit 220.

Figure 4:
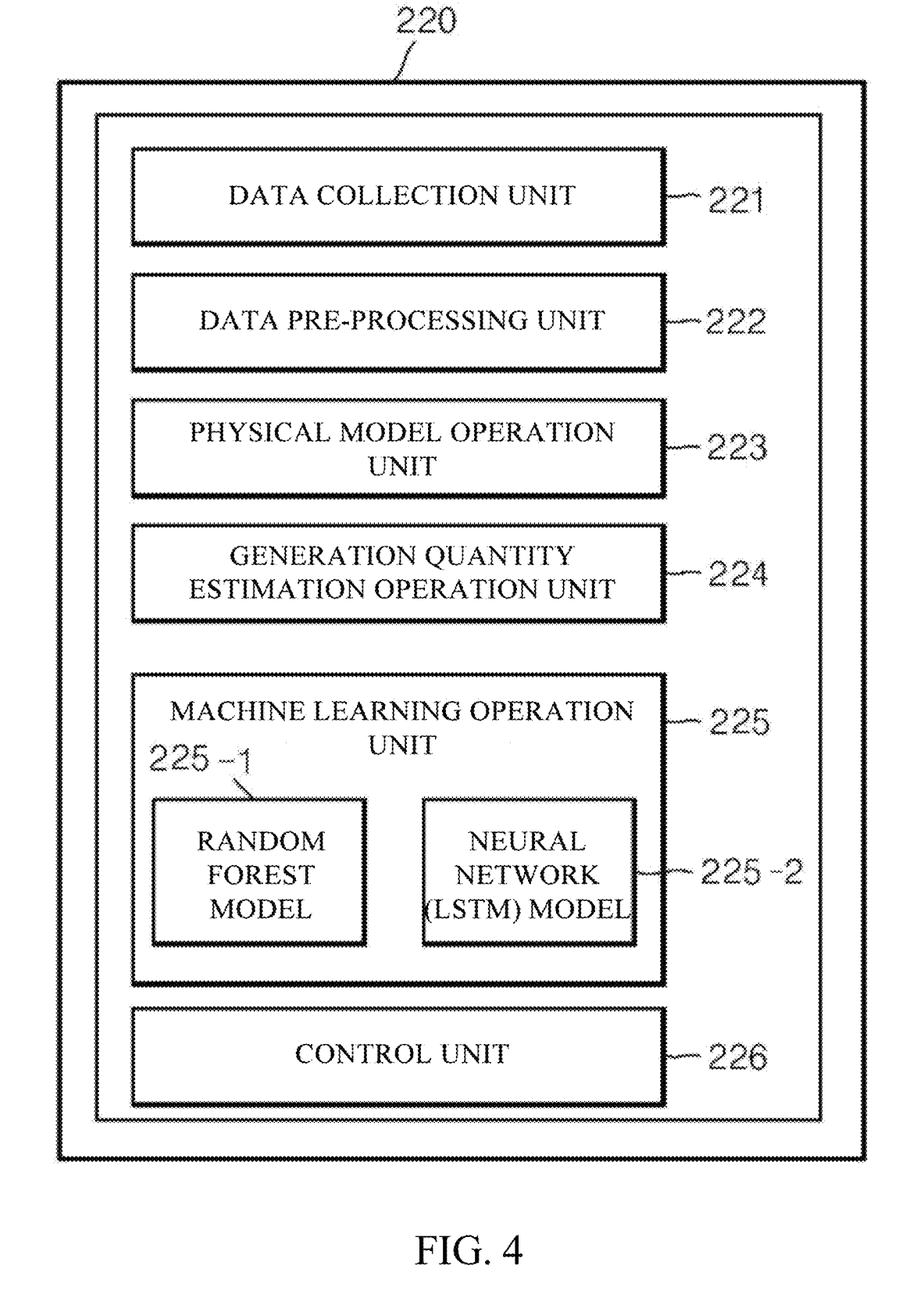
FIG. 4 is a block diagram illustrating a configuration of a site generation quantity calculation unit of FIG. 2.

FIG. 4 is a block diagram illustrating a configuration of the site generation quantity calculation unit of FIG. 2. Referring to FIG. 4, the site generation quantity calculation unit 220 may include a data collection unit 221, a data pre-processing unit 222, a physical model operation unit 223, a generation quantity estimation operation unit 224, a machine learning operation unit 225 and a control unit 226.

The site generation quantity calculation unit 220 may collect data necessary upon prediction, may operate various physical models and generation quantity estimates, and may calculate the final real-time generation quantity prediction value for each site through machine learning.

More specifically, the data collection unit 221 of the site generation quantity calculation unit 220 collects data necessary upon prediction of a generation quantity from the database 300 or an external server, such as a weather center. In this case, the data necessary upon prediction includes various constants related to various weather elements related to an external temperature, a solar radiation quantity, and humidity and a module, physical characteristics of the solar energy module array 11, such as a cell temperature of the solar energy module, and a generation quantity actual-measurement value generated by an actually connected solar energy module array 11 from the RTU 100-1. In this case, cell temperature estimates calculated through a physical model in addition to data measured by the sensors may be used for the cell temperature of the solar energy module. In this case, the collected data may include data at current timing for predicting a real-time generation quantity.

Furthermore, the data pre-processing unit 222 may select characteristics to be used for prediction, and may remove an abnormal value from collected data or fill the collected data with an omission value. Furthermore, the data pre-processing unit 222 may convert a real-time generation quantity actual-measurement value, collected with respect to a benchmarking site of each benchmarking group, into a generation quantity per capacity, that is, a normalized real-time generation quantity, by dividing the real-time generation quantity actual-measurement value by the capacity of the corresponding benchmarking site.

Furthermore, the data pre-processing unit 222 may perform various data pre-processing tasks, such as normalization, through scaling suitable for each characteristic, for example, a linear transform between 0 and 1, averaging and dispersion.

The physical model operation unit 223 is a mode for calculating physical model values, such as a plane of array (PoA) and an effective irradiance, which are directly applied to a panel of the solar energy module array 11.

The generation quantity estimation operation unit 224 calculates estimates of DC or AC power based on a solar energy module cell temperature and an effective irradiance.

The machine learning operation unit 225 may generate a prediction model for each site by using a machine learning model, such as a random forest 225-1 or an LSTM model 225-2, and may generate a machine learning prediction value through the prediction model.

For example, the machine learning operation unit 225 may calculate a prediction value by inputting input data to a trained model having an artificial neural network structure. Alternatively, the machine learning operation unit 225 may generate a plurality of tree models by using the existing data, and may generate the final prediction value by averaging prediction values generated through several tree models.

In this case, the final prediction value generated by the machine learning operation unit 225 may be a normalized generation quantity prediction value of a specific site at current timing, which is predicted based on a normalized generation quantity of a benchmarking site at current timing.

Accordingly, the control unit 226 may calculate the final real-time generation quantity prediction value by multiplying the normalized generation quantity prediction value of the specific site at current timing, which is calculated by the machine learning operation unit 225, by the capacity of the corresponding specific site.

Furthermore, the control unit 226 may separately set setting values to be used for machine learning and inference of a prediction model. Furthermore, the setting values to be used for learning and inference include a period to be used for learning, a prediction model to be used, and a period to be used for prediction.

The total generation quantity estimation unit 230 may estimate a total real-time generation quantity of all sites by summing real-time generation quantity prediction value of the respective sites and a real-time generation quantity actual-measurement value of a benchmarking site.

In this case, the site setting unit 210, the site generation quantity calculation unit 220, and the total generation quantity estimation unit 230 may be implemented as a software module, a hardware module or a combination of a software module and a hardware module.

The processor 240 may execute at least some software if the site setting unit 210, the data pre-processing unit 222, the pre-processing unit 222, the physical model operation unit 223, the generation quantity estimation operation unit 224 or the machine learning operation unit 225, or the total generation quantity estimation unit 230 is a software module or a combination of a software module and a hardware module.

The communication unit 250 may collect data from an external server or the database 300, or may transmit, to the power selling and purchase system 400, a real-time generation quantity prediction value for each site, calculated by the site generation quantity calculation unit 220, and a total real-time generation quantity estimate of all sites, which is estimated by the total generation quantity estimation unit 230.

Hereinafter, an operation of estimating, by the estimation system 1000, a total real-time generation quantity according to an embodiment of the present disclosure is described in detail with reference to FIGS. 2 to 8.

Figure 5:
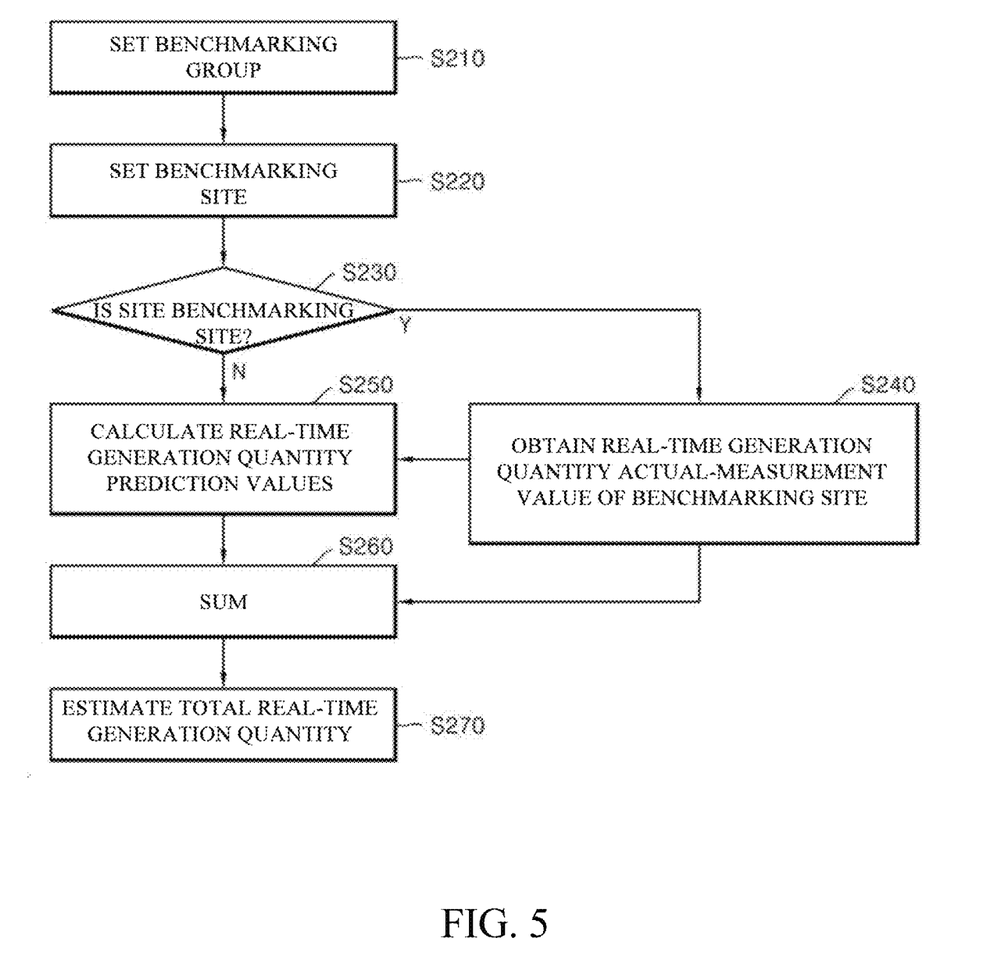
FIG. 5 is a flowchart for describing a method of estimating, by the system for estimating a real-time renewable energy generation quantity, a real-time generation quantity according to an embodiment of the present disclosure.
Figure 7:
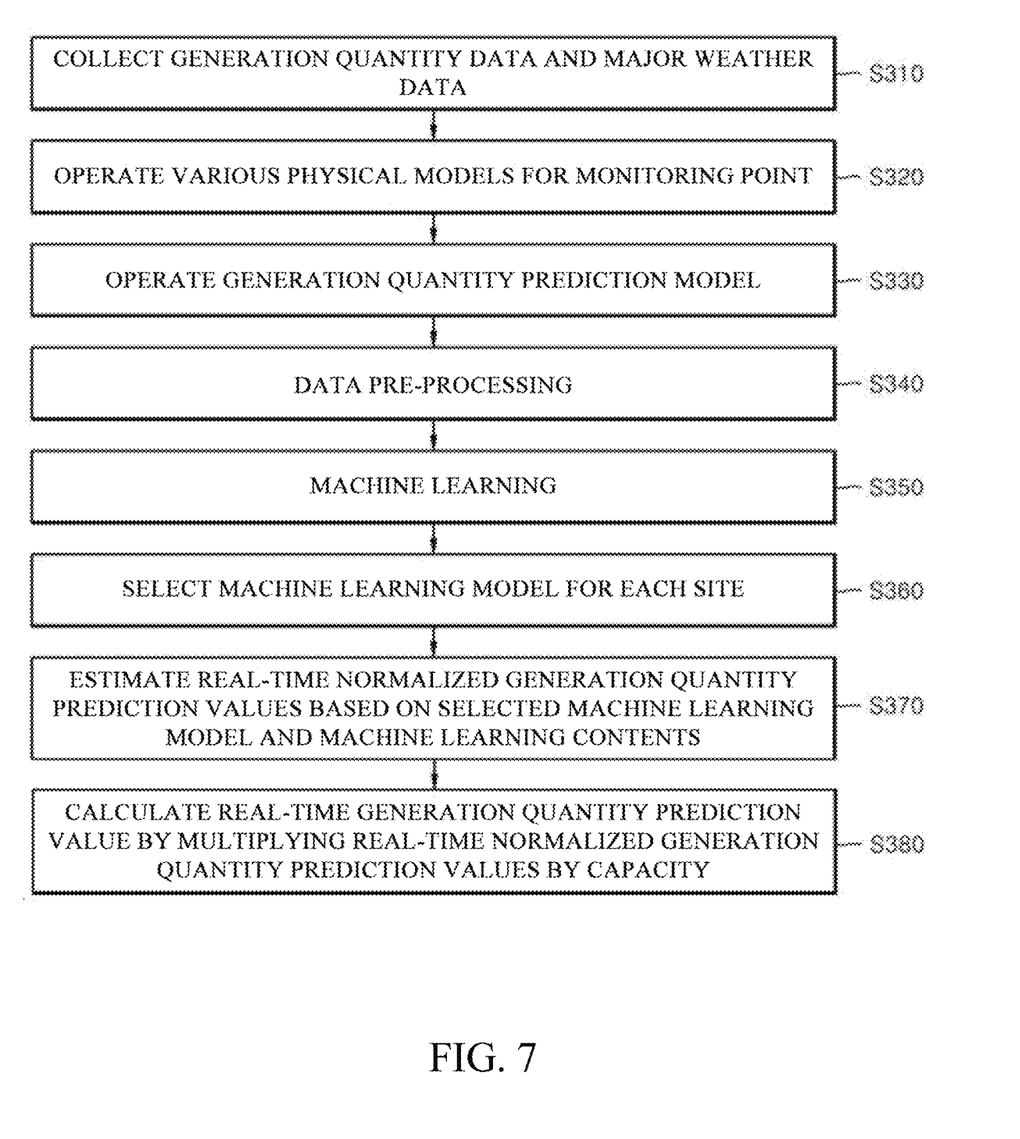
FIG. 7 is a flowchart for describing the calculation of a real-time generation quantity prediction value for each site in step S250 of FIG. 5.
Figure 8:
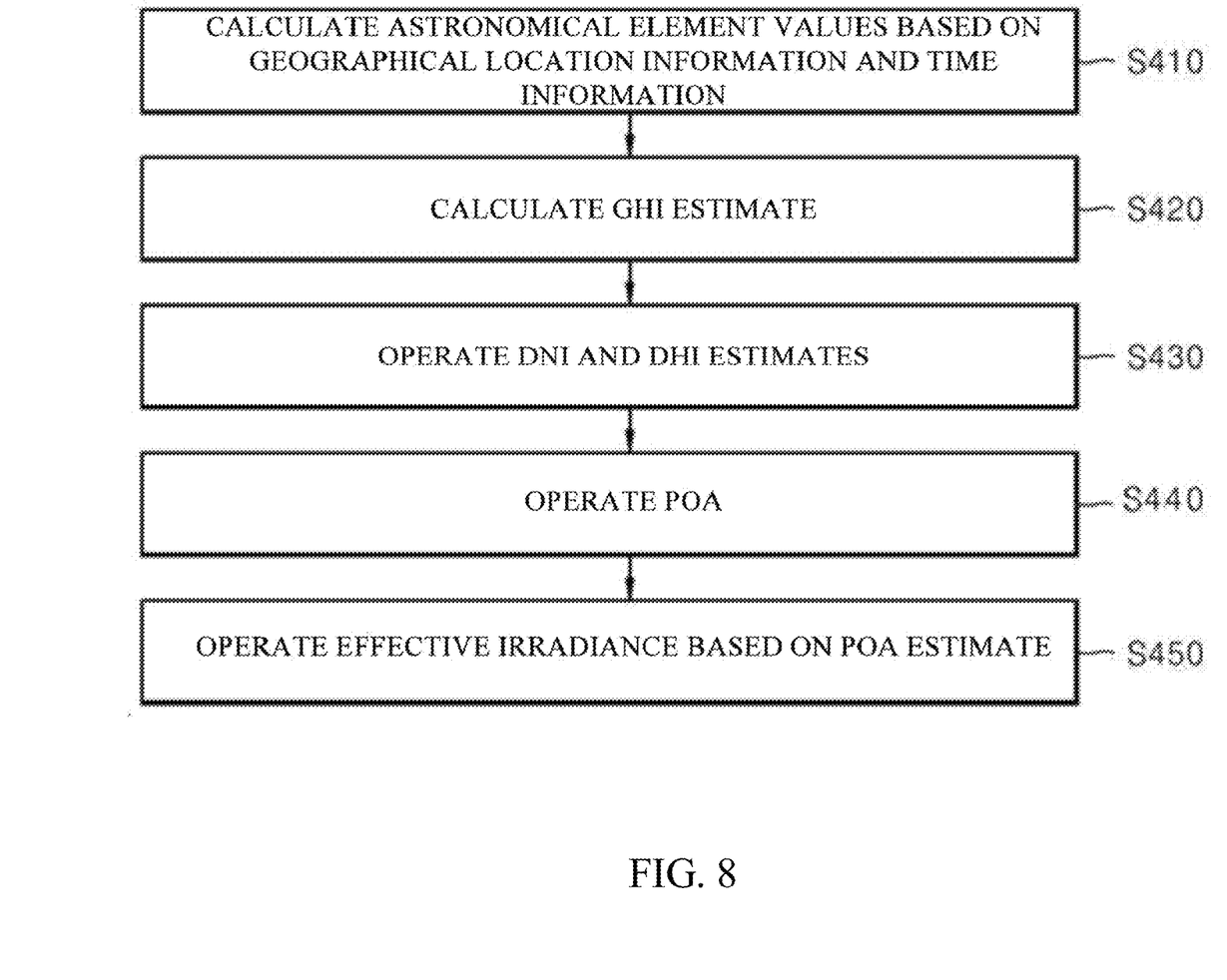
FIG. 8 is a flowchart for describing the operation of a physical model in step S320 of FIG. 7.

FIG. 5 is a flowchart for describing a method of estimating, by the estimation system, a real-time generation quantity according to an embodiment of the present disclosure. FIG. 7 is a flowchart for describing the calculation of a real-time generation quantity prediction value in step S250 of FIG. 5. FIG. 8 is a flowchart for describing the operation of a physical model in step 320 of FIG. 7.

Referring to FIG. 5, the site setting unit 210 of the estimation server 200 may set the number of benchmarking groups, and may set a benchmarking group by setting a center location of each benchmarking group by using a preset gathering algorithm (S210).

Figure 6:
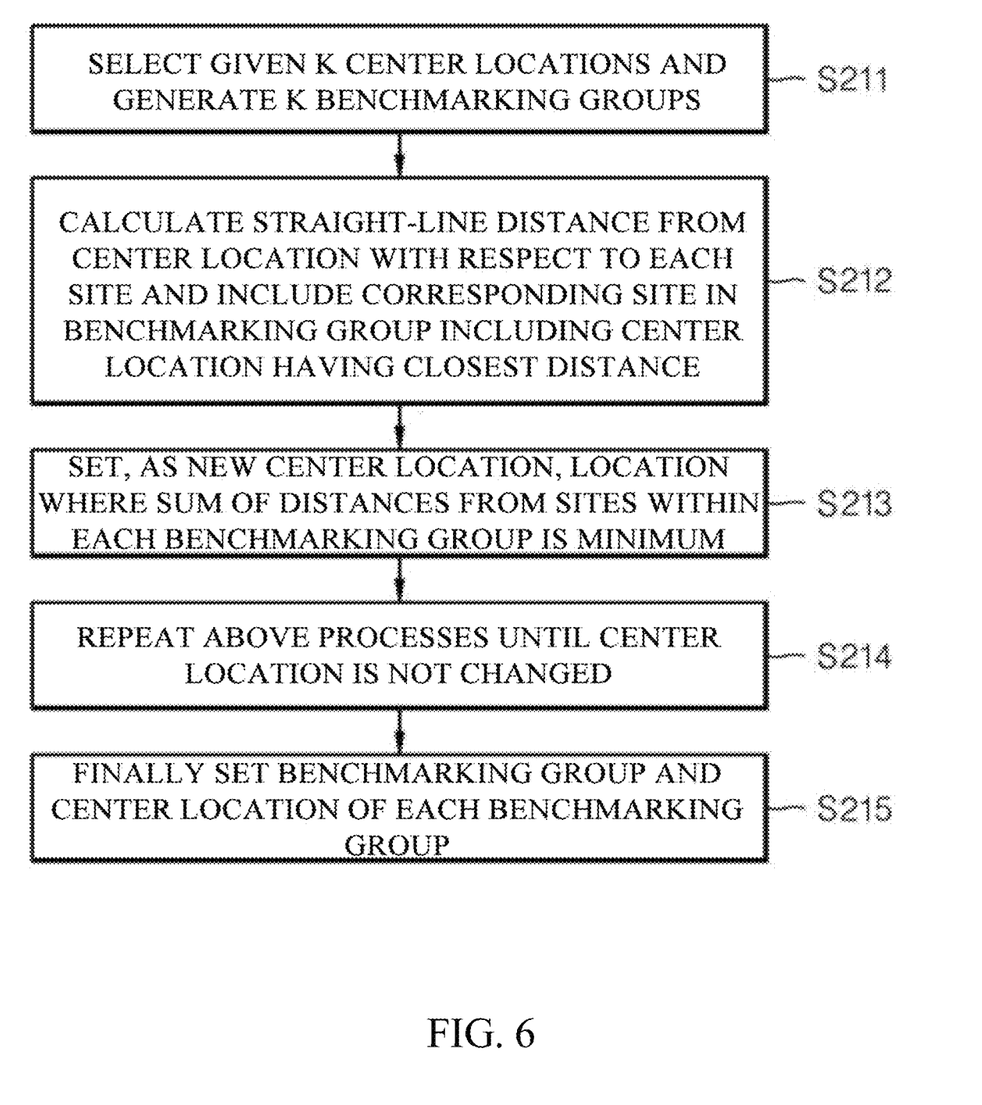
FIG. 6 is a flowchart for describing the setting of a benchmarking group in step S210 of FIG. 5.

Specifically, referring to FIG. 6, given k center locations are randomly selected, and k benchmarking groups are generated (S211). Next, a straight-line distance from a center location randomly selected with respect to each site may be calculated. The corresponding site may be included in a benchmarking group including a center location having the closest distance (S212).

Furthermore, a location where the sum of distances from sites within each benchmarking group is a minimum may be set as a new center location (S213). In this case, the above processes S212 and S213 may be repeatedly performed until the center location is not changed (S214). Accordingly, finally, a benchmarking group and the center location of each benchmarking group may be set (S215).

Next, the site setting unit 210 may set, as a benchmarking site of a corresponding benchmarking group, a site located at the shortest distance from the center location of each benchmarking group (S220). Next, the site setting unit 210 may obtain a real-time generation quantity actual-measurement value (S240) of the set benchmarking site (S230:Y), and may calculate real-time generation quantity prediction values of other specific sites within the corresponding benchmarking group except the set benchmarking site (S250).

Referring to FIG. 7, the estimation server 200 may collect generation quantity data and major weather data (S310).

More specifically, the data collection unit 221 of the estimation server 200 may obtain, as real-time generation quantity data, generation quantity data at predetermined time intervals through the RTU 100. Furthermore, the data collection unit 221 may also collect information on the capacity of each site from the RTU 100.

Furthermore, the data collection unit 221 may obtain major weather element values. In this case, the data collection unit 221 may obtain the major weather element values from a weather center server or the various sensors 350. The weather element values include elements, such as a temperature, humidity, a cloud amount, a wind velocity, and a wind direction. In the case of a weather center server, a forecast value may be used in an inference process because forecast data in addition to observation is provided.

Next, physical models for a monitoring point (i.e., a point at which the solar energy module array is installed) may be operated (S320). More specifically, the physical model operation unit 223 operates a solar radiation estimate to be directly applied to a corresponding solar energy module array 11 based on a weather element value, geographical information of a monitoring point, and information on current timing.

Referring to FIG. 8, in order to describe a physical model operation, the physical model operation unit 223 calculates astronomical element values related to the location of the sun based on geographical location information and time information (S410). The astronomical element values used in this case include a local solar time, an equation of time, an azimuth angle, a zenith angle, an elevation angle, an angle of incidence (AOI), an air mass, etc.

When the astronomical element values are calculated, the physical model operation unit 223 calculates a global horizontal irradiance (GHI) estimate based on a weather element value and a theoretical astronomical element value (S420). Specifically, an estimation operation is performed as summed linear coupling based on weather element values, such as a temperature, humidity, a wind velocity, and a cloud amount, by a coefficient. A value experimentally obtained from an area where the corresponding solar energy module array 11 is installed is used as the coefficient.

$$\text{GHI estimate} = \text{sun constant} * \sin(\text{solar altitude angle in corresponding area}) * (C_0 + C_1 * \text{cloud amount} + C_2 * \text{cloud amount}^2 + C_3 * (\text{current temperature} - \text{temperature three hours ago}) + C_4 * \text{relative humidity} + C_5 * \text{wind velocity}) + D \quad \text{(Equation 1)}$$

In Equation 1, $C_0$ to $C_5$ and D are coefficients experimentally obtained in a predetermined area based on a location of the solar energy module array 11 to be operated.

Furthermore, the physical model operation unit 223 calculates an estimate of a direct normal irradiance (DNI) and an estimate of a diffuse horizontal irradiance (DHI) based on the theoretical astronomical element value and the GHI estimate (S430).

Specifically, the physical model operation unit 223 calculates a serenity coefficient and a serenity reference coefficient, determines whether weather is clear (clear sky) or cloudy (cloudy sky) based on a relation between the two values, and calculates a scattering solar radiation based on a result of the determination. Furthermore, the physical model operation unit 223 calculates a scattering solar radiation based on the serenity coefficient and the serenity reference coefficient, and calculates estimates of the DNI and the DHI based on the scattering solar radiation.

$$\text{serenity coefficient} = \text{GHI}/(\text{sun constant} * \sin(\text{solar altitude angle in corresponding area}))$$

$$\text{serenity reference coefficient} = 0.4268 + 0.1934 * \sin(\text{solar altitude angle in corresponding area}) \quad \text{(Equation 2)}$$

In this case, the scattering solar radiation is calculated like (Equation 3) or (Equation 4).

$$\text{Scattering solar radiation} = \text{serenity coefficient} - (1.107 + 0.03569 * \sin(\text{solar altitude angle}) + 1.1681 * \sin^2(\text{solar altitude angle})) * (1 - \text{serenity coefficient})^3 \text{ ((clear sky) in the case of serenity coefficient} >= \text{serenity reference coefficient)} \quad \text{(Equation 3)}$$

$$\text{scattering solar radiation} = (3.996 - 3.862 * \sin(\text{solar altitude angle}) + 1.540 * \sin^2(\text{solar elevation angle}))^3 * (\text{serenity coefficient})^3 \text{ ((cloudy sky) in the case of serenity coefficient} < \text{serenity reference coefficient)} \quad \text{(Equation 4)}$$

The estimates of the DNI and the DHI are calculated like Equation 5 and Equation 6 below.

$$\text{DNI estimate} = \text{sun constant} * \sin(\text{solar altitude angle}) * \text{scattering solar radiation} * (1 - \text{clear coefficient}) / (1 - \text{scattering solar radiation}) \quad \text{(Equation 5)}$$

$$\text{DHI estimate} = \text{sun constant} * \sin(\text{solar altitude angle}) * (\text{serenity coefficient} - \text{scattering solar radiation}) / (1 - \text{scattering solar radiation}) \quad \text{(Equation 6)}$$

Furthermore, the physical model operation unit 223 calculates estimates of plane of array (PoA) elements (PoA beam, PoA sky diffuse, PoA ground reflected, etc.) based on the estimates of the GHI, DNI and DHI, the theoretical astronomical element value, a direction in which the solar energy panel is installed, angle information, etc. (S440).

The PoA ($E_{PoA}$) may be calculated like the following equation.

$$E_{PoA} = E_b + E_g + E_d \quad \text{(Equation 7)}$$

In this case, $E_b$ is the PoA beam element, $E_g$ is the PoA ground reflected element, and $E_d$ is the PoA sky-diffuse element.

$E_b$ may be calculated based on the DNI and the AOI as follows, for example.

$$E_b = DNI * \cos(AOI)$$

$$AOI = \cos^{-1}[\cos(è_z)\cos(è_T) + \sin(è_T)\sin(è_z)\cos(è_A - è_{A,ar\text{-}ray})] \quad \text{(Equation 8)}$$

In this case, $è_A$ and $è_z$ are an azimuth angle and zenith angle of the sun, respectively. $è_T$ and $è_{A,array}$ are a tilt and azimuth angle of the solar energy module array 11, respectively.

Meanwhile, the PoA ground reflected element may be calculated like Equation 9 below.

$$Eg = GHI * (\text{surface reflectivity (Albedo) in corresponding area}) * (1 - \cos(è_{T.surf}))/2 \quad \text{(Equation 9)}$$

In this case, $è_{T.surf}$ is an angle formed by the surface of the earth and the solar energy module array 11.

Meanwhile, $E_d$ may be calculated like Equation 10 below.

$$E_d = DHI \times \left[(1 - F_1)\left(\frac{1 + \cos(\theta_T)}{2}\right) + F_1\left(\frac{a}{b}\right) + F_2\sin(\theta_T)\right] \quad \text{(Equation 10)}$$

$$F_1 = \max\left[0, \left(f_{11} + f_{12}\Delta + \frac{\pi\theta_Z}{180°}f_{12}\right)\right]$$

$$F_2 = f_{21} + f_{22}\Delta + \frac{\pi\theta_Z}{180°}f_{23}$$

$$a = \max(0, \cos(AOI))$$

$$b = \max(\cos(85°), \cos(\theta_Z))$$

$$\varepsilon = \frac{(DHI + DNI)/DHI + \kappa\theta_Z^3}{1 + \kappa\theta_Z^3} \quad \text{(Equation 11)}$$

In this case, the value ê is a constant, that is, 1.041 in a radian unit and 5.535*10−6 in a degree unit.

Meanwhile, the value Ä is defined like Equation 12 below.

$$\Delta = \frac{DHI \times AM_a}{E_a} \quad \text{(Equation 12)}$$

In this case, $AM_a$ means an air mass value, and $E_a$ means an extraterrestrial radiation.

Furthermore, the coefficients $f_{11}$ to $f_{23}$ are determined as follows based on bins of clearness ($\varepsilon$). The section of the bins of clearness is determined as follows based on the value $\varepsilon$.

TABLE 1

| ε section | Minimum value | Maximum value |
|---|---|---|
| 1 cloudy | 1 | 1.065 |
| 2 | 1.065 | 1.230 |
| 3 | 1.230 | 1.500 |
| 4 | 1.500 | 1.950 |
| 5 | 1.950 | 2.800 |
| 6 | 2.800 | 4.500 |
| 7 | 4.500 | 6.200 |
| 8 clear | 6.200 | — |

Furthermore, the coefficients $f_{11}$ to $f_{23}$ are determined as follows for each section.

TABLE 2

| ε Section | $f_{11}$ | $f_{12}$ | $f_{13}$ | $f_{21}$ | $f_{22}$ | $f_{23}$ |
|---|---|---|---|---|---|---|
| 1 | −0.008 | 0.588 | −0.062 | −0.06 | 0.072 | −0.022 |
| 2 | 0.13 | 0.683 | −0.151 | −0.019 | 0.066 | −0.029 |
| 3 | 0.33 | 0.487 | −0.221 | 0.055 | −0.064 | −0.026 |
| 4 | 0.568 | 0.187 | −0.295 | 0.109 | −0.152 | −0.014 |
| 5 | 0.873 | −0.392 | −0.362 | 0.226 | −0.462 | 0.001 |
| 6 | 1.132 | −1.237 | −0.412 | 0.288 | −0.823 | 0.056 |
| 7 | 1.06 | −1.6 | −0.359 | 0.264 | −1.127 | 0.131 |
| 8 | 0.678 | −0.327 | −0.25 | 0.156 | −1.377 | 0.251 |

Furthermore, an effective irradiance ($E_e$) is calculated based on the PoA estimate ($E_{POA}$) (S450) (Equation 13)

$$E_e = E_b * \text{aoi\_modifier} + E_g + E_d$$

In this case, aoi_modifier is a value obtained by directly experimenting on the solar energy module array 11 and is a constant based on the rule of experiences.

Referring back to FIG. 7, a generation quantity prediction model is operated by calculating a DC power estimate based on the effective irradiance and the cell temperature estimate of the solar energy module array 11 (S330).

$$P_{mp} = \frac{E_c}{E_0} P_{mp0}[1 + \gamma(T_c - T_0)] \quad \text{(Equation 14)}$$

In this case, $E_0$ is 1000 W/m², $P_{mp}$ is a DC power estimate, $P_{mp0}$ is reference power in a DC rated output voltage, $\gamma$ is a constant experimentally determined in the solar energy module array 11, $T_c$ is a surface temperature, and $T_0$ means a reference temperature (25° C.). Furthermore, an AC power estimate is calculated based on the DC power estimate and inverter information (efficiency, a loss rate, etc.).

Furthermore, time information is added to the calculated various physical models and generation quantity prediction model. In this case, the time information may include Day of Year (DoY) and Time of Day (ToD).

A data pre-processing process is performed on the generation quantity prediction values based on the calculated various physical models for machine learning (S340).

For example, in the data pre-processing process, characteristics used for prediction may be selected, an abnormal value may be removed, an omission value is filled, or scaling suitable for characteristics of input data for each piece of machine learning may be performed. The aforementioned scaling may include a process of dividing an generation quantity, for example, by a capacity and performing scaling, linearly transforming the generation quantity in a section 0-1, or normalizing the generation quantity through averaging and dispersion. Alternatively, in the aforementioned data pre-processing process, a transform, such as one hot encoding, may be performed according to circumstances.

In particular, in order to predict real-time individual generation quantities of specific sites other than a benchmarking site within each benchmarking group, the data pre-processing unit 222 of the estimation server 200 according to an embodiment of the present disclosure may select a benchmarking site closest to a specific site, that is, a prediction target, and may convert generation quantity time series data at current timing of the selected benchmarking site, collected by the data collection unit 221, or at recent timing k including the current timing into a normalized generation quantity by dividing the generation quantity time series data by capacity information of the selected benchmarking site.

After the data pre-processing is performed, machine learning may be performed on the prediction model by using the calculated data as an input (S350), a machine learning model may be selected for each site (S360), and real-time normalized generation quantity prediction values of specific sites within each benchmarking group may be predicted (S370).

In this case, the prediction model may be generated for each site. In this case, the control unit 226 may separately set setting values to be used for the learning and inference of the prediction model for each site. Furthermore, the setting values to be used for the learning and inference include a section to be used for the learning, a prediction model to be used, and a section to be used for the inference. Furthermore, the control unit 226 may select a prediction model to be used for each site. In this case, the selection may be determined based on a difference between a generation quantity and prediction value of an actual solar energy module array 11.

In this case, the model to be used may include the random forest and the LSTM model, for example. A generation quantity prediction value at the same timing is inferred based on values of several input elements at prediction target timing. Only a relation between input data and output data at specific timing is considered without considering a relation between pieces of adjacent timing.

The prediction model learns a repetitive determination reference (tree model) having a tree form, which describes such a relation based on the past data. Furthermore, the prediction model classifies new input data into one of several nodes based on the learnt repetitive determination reference having a tree form, and infers a prediction value as a representative value of the classified node.

After prediction values are generated several times using several determination references having a tree forms, overfitting is prevented using an average value of the prediction values. That is, the random forest model may generate a plurality of tree models based on a relation between input data and output data, and may predict a normalized generation quantity prediction value of a corresponding specific site at current timing based on generation quantity prediction values predicted based on the tree models, respectively.

In this case, the input data may include a normalized generation quantity of a benchmarking site at current timing, major weather elements, a solar radiation estimate, reference DC/AC power, time information, a generation quantity estimate (DC/AC power estimates), etc. The output data may include a normalized generation quantity prediction value of a corresponding specific site at current timing.

Furthermore, the LSTM model calculates a prediction value based on machine learning by using an artificial neural network structure having a temporal connection relation (time-series) based on values of input elements at target prediction timing, that is, at current timing or in k steps (wherein k is a natural number) including current timing.

In this case, the input elements include a normalized generation quantity of a benchmarking site, weather elements, a solar radiation quantity estimate, reference DC/AC power, DC/AC power estimates based on a physical model, and a k-step time-series value for time information. An output element includes a normalized generation quantity prediction value of a corresponding specific site at current timing.

Furthermore, according to circumstances, optimum hyper parameters for a corresponding prediction model may be set and used through hyper parameter optimization (HPO). In this case, the hyper parameters may include a learning rate, iterations, the number of hidden nodes of the LSTM, a sequence length in an LSTM cell, the type of activation function, a degree of depth of a model, the type of model input, etc.

Learning speed and accuracy of the artificial neural network may include a characteristic greatly affected by the hyper parameters in addition to a structure of the artificial neural network and the type of learning optimization algorithm. Accordingly, in order to obtain a better learning model, to set proper hyper parameters in addition to determining a proper structure of the artificial neural network and a proper learning algorithm may be important.

The hyper parameter may be set as an optimum value that provides stable learning speed and accuracy as a result of learning after an artificial neural network is trained while experimentally setting the value as various values. Accordingly, prediction may become finer.

Furthermore, when a normalized generation quantity prediction value of a corresponding specific site at current timing is calculated, a generation quantity value predicted through a post-processing process, such as a scaling return, for each user or for each site may be transmitted in a proper format and procedure.

Next, the final real-time generation quantity prediction value may be calculated by multiplying the normalized generation quantity prediction value of the specific site at current timing, calculated through the prediction model, by the capacity of the corresponding specific site (S380).

When real-time generation quantity prediction values of all the specific sites 2 included in each benchmarking group are calculated, a total real-time generation quantity of all the sites may be estimated (S270) by adding the real-time generation quantity prediction values and the real-time generation quantity actual-measurement values of the benchmarking site (S260).

Accordingly, according to the present disclosure, there is provided the estimation system capable of accurately estimating a generation quantity of the solar energy module array for each site and real-time generation quantities of all the sites.

Furthermore, according to embodiments of the present disclosure, the accuracy of prediction through the existing artificial intelligence-based machine learning can be significantly improved using a normalized real-time generation quantity actual-measurement value of a benchmarking site for each benchmarking group and a physical model as inputs.

In particular, according to a conventional technology, input is performed through simple data pre-processing, such as the removal of noise, data normalization, and a change in the format with respect to input data. Prediction is performed on a prediction algorithm based on the optimization of machine learning, such as a neural network, without separate consideration. In such a case, it is very difficult to commercially use prediction based on machine learning because performance of the prediction based on machine learning is very low. In particular, the accuracy of prediction is very low in commercially using prediction based on machine learning in a virtual power plant (VPP) required to operate based on precise estimates, distributed power/distributed resources (DERMS), a power exchange, etc. It is difficult to predict a total real-time generation quantity of all sites.

However, according to the present disclosure, an accurate generation quantity which may be commercially used in a virtual power plant (VPP), distributed power/distributed resources (DERMS), and a power exchange can be predicted using normalized real-time generation quantities of benchmarking sites based on a benchmarking group and data processed through physical/mathematical modeling as inputs to machine learning.

At least some of the aforementioned embodiments of the present disclosure may be implemented in a computer-readable recording medium as a code readable by a computer. For example, the operations of the estimation server 200 illustrated in FIGS. 2 to 8 may be implemented in a computer-readable recording medium as a code readable by a computer.

The computer-readable recording medium may include all types of recording devices in which data readable by a computer system is stored.

Examples of the computer-readable recording medium may include a ROM, a RAM, a CD-ROM, a magnetic tape, a floppy disk, an optical data storage, etc., and may be implemented in the form of carrier waves (e.g., transmission through the internet).

Furthermore, the computer-readable recording medium is distributed and implemented in computer systems connected over a network, so that a code readable by a computer may be stored and executed in a distributed manner.

Although the embodiments of the present disclosure have been described with reference to the accompanying drawings, the present disclosure is not limited to the embodiments and may be fabricated in various different forms. A person of ordinary knowledge in the art to which the present disclosure pertains may understand that the present disclosure may be implemented in other detailed forms without changing the technical spirit or essential characteristics of the present disclosure. Accordingly, it is to be understood that the aforementioned embodiments are only illustrative, but are not limitative in all aspects.

What is claimed is:

1. A system comprising:
    an estimation system for estimating a real-time renewable energy generation quantity, comprising:
    a site setting unit for setting a benchmarking group based on geographical locations of a plurality of renewable energy generation sites and setting a benchmarking site for each benchmarking group;
    a site generation quantity calculation unit for calculating a real-time generation quantity prediction value of each of the sites except the corresponding benchmarking site among the sites included in the benchmarking group by using a preset prediction model based on a real-time generation quantity actual-measurement value of the corresponding benchmarking site;
    a total generation quantity estimation unit for estimating a total real-time generation quantity of all the sites by summing the calculated real-time generation quantity prediction values for the respective sites and the real-time generation quantity actual-measurement value of the corresponding benchmarking site; and
    a power exchange configured to sell and purchase power and in communication with the estimation system to be supplied with the total real-time generation quantity of all the sites such that power is sold and purchased while securing sufficient power for stable market operation,
    wherein input data of the preset prediction model comprises, as the input data, a normalized generation quantity of a benchmarking site at current timing, weather elements, a solar radiation estimate, reference DC/AC power, a DC/AC power estimate, and time information; and
    wherein the site generation quantity calculation unit is configured to:
        obtain a corresponding capacity by selecting a benchmarking site closest to a specific site which is a target whose real-time generation quantity prediction value is to be calculated, and
        calculate a normalized generation quantity of the benchmarking site by dividing a generation quantity actual-measurement value of the selected benchmarking site at current timing by the corresponding capacity.

2. The system of claim 1, wherein the site setting unit is configured to set, as a benchmarking site of each benchmarking group, a site located at a shortest distance from a center location of the corresponding benchmarking group among generation sites included in the corresponding benchmarking group.

3. The system of claim 2, wherein the site setting unit is configured to set the center location of each benchmarking group by applying a preset gathering algorithm to all the sites.

4. The system of claim 3, wherein the site setting unit is configured to:
    randomly select given k center locations and generate k benchmarking groups based on the geographical locations, and
    finally set a benchmarking group and the center location of each benchmarking group by repeatedly performing a first process of calculating a straight-line distance from the center location randomly selected with respect to each site and including the corresponding site in a benchmarking group including a center location having a closest distance and a second process of setting, as a new center location, a location where a sum of distances from sites within each benchmarking group is a minimum until the center location is not changed.

5. The system of claim 1, wherein the site generation quantity calculation unit is configured to calculate the real-time generation quantity prediction value of each of the sites by using one prediction model of a random forest or a long short term memory (LSTM).

6. The system of claim 5, wherein:
    output data of the random forest model comprises a normalized generation quantity prediction value of a corresponding specific site at current timing; and
    the random forest model is configured to generate a plurality of tree models based on a relation between the input data and the output data and is configured to predict the normalized generation quantity prediction value of the corresponding specific site at the current timing based on a generation quantity prediction value predicted through each tree model.

7. The system of claim 5, wherein:
    the LSTM model is configured to calculate a prediction value based on machine learning by using an artificial neural network structure having a temporal connection relation in a time-series format based on values of input elements at target prediction timing, that is, at current timing or in k steps including current timing, wherein k is a natural number;
    the values of the input elements comprise a normalized generation quantity of a benchmarking site, weather elements, a solar radiation quantity estimate, reference DC/AC power, DC/AC power estimates based on a physical model, and a k-step time-series value for time information; and
    an output element comprises a normalized generation quantity prediction value of a corresponding specific site at current timing.

8. The system of claim 1, wherein the site generation quantity calculation unit is configured to calculate a final real-time generation quantity prediction value by multiplying a normalized generation quantity prediction value of the specific site at current timing, which is calculated through the prediction model, by the capacity of the corresponding specific site.

9. A system comprising:
an estimation system for estimating a real-time renewable energy generation quantity, comprising:
a site setting unit for setting a benchmarking group based on geographical locations of a plurality of renewable energy generation sites and setting a benchmarking site for each benchmarking group;
a site generation quantity calculation unit for calculating a real-time generation quantity prediction value of each of the sites except the corresponding benchmarking site among the sites included in the benchmarking group by using a preset prediction model based on a real-time generation quantity actual-measurement value of the corresponding benchmarking site;
a total generation quantity estimation unit for estimating a total real-time generation quantity of all the sites by summing the calculated real-time generation quantity prediction values for the respective sites and the real-time generation quantity actual-measurement value of the corresponding benchmarking site; and
a power exchange configured to sell and purchase power and in communication with the estimation system to be supplied with the total real-time generation quantity of all the sites such that power is sold and purchased while securing sufficient power for stable market operation,
wherein the site generation quantity calculation unit is configured to calculate the real-time generation quantity prediction value of each of the sites by using one prediction model of a random forest or a long short term memory (LSTM), and
wherein:
input data of the random forest model comprises, as the input data, a normalized generation quantity of a benchmarking site at current timing, weather elements, a solar radiation estimate, reference DC/AC power, a DC/AC power estimate, and time information;
output data of the random forest model comprises a normalized generation quantity prediction value of a corresponding specific site at current timing; and
the random forest model is configured to generate a plurality of tree models based on a relation between the input data and the output data and is configured to predict the normalized generation quantity prediction value of the corresponding specific site at the current timing based on a generation quantity prediction value predicted through each tree model.

10. A system comprising:
an estimation system for estimating a real-time renewable energy generation quantity, comprising:
a site setting unit for setting a benchmarking group based on geographical locations of a plurality of renewable energy generation sites and setting a benchmarking site for each benchmarking group;
a site generation quantity calculation unit for calculating a real-time generation quantity prediction value of each of the sites except the corresponding benchmarking site among the sites included in the benchmarking group by using a preset prediction model based on a real-time generation quantity actual-measurement value of the corresponding benchmarking site;
a total generation quantity estimation unit for estimating a total real-time generation quantity of all the sites by summing the calculated real-time generation quantity prediction values for the respective sites and the real-time generation quantity actual-measurement value of the corresponding benchmarking site; and
a power exchange configured to sell and purchase power and in communication with the estimation system to be supplied with the total real-time generation quantity of all the sites such that power is sold and purchased while securing sufficient power for stable market operation,
wherein the site generation quantity calculation unit is configured to calculate the real-time generation quantity prediction value of each of the sites by using one prediction model of a random forest or a long short term memory (LSTM), and
wherein:
the LSTM model is configured to calculate a prediction value based on machine learning by using an artificial neural network structure having a temporal connection relation in a time-series format based on values of input elements at target prediction timing, that is, at current timing or in k steps including current timing, wherein k is a natural number;
the values of the input elements comprise a normalized generation quantity of a benchmarking site, weather elements, a solar radiation quantity estimate, reference DC/AC power, DC/AC power estimates based on a physical model, and a k-step time-series value for time information; and
an output element comprises a normalized generation quantity prediction value of a corresponding specific site at current timing.

* * * * *